(12) United States Patent
Neffling

(10) Patent No.: US 6,271,724 B1
(45) Date of Patent: Aug. 7, 2001

(54) LINEARIZATION METHOD AND AMPLIFIER ARRANGEMENT

(75) Inventor: Toni Neffling, Espoo (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/547,371

(22) Filed: Apr. 11, 2000

Related U.S. Application Data

(63) Continuation of application No. PCT/FI98/00832, filed on Oct. 26, 1998.

(30) Foreign Application Priority Data

Oct. 29, 1997 (FI) ........................................................ 974088

(51) Int. Cl.$^7$ .................................................... H03F 1/26
(52) U.S. Cl. ........................................... 330/149; 330/136
(58) Field of Search ..................................... 330/136, 149; 375/296, 297; 455/63

(56) References Cited

U.S. PATENT DOCUMENTS

| | | | |
|---|---|---|---|
| 4,291,277 | 9/1981 | Davis et al. ........................ | 330/149 |
| 4,462,001 | 7/1984 | Girard ................................. | 330/149 |
| 5,049,832 | 9/1991 | Cavers ................................. | 330/149 |
| 5,193,224 | * 3/1993 | McNicol et al. ................... | 455/63 X |
| 5,266,906 | * 11/1993 | Inahashi ............................. | 330/149 |
| 5,489,875 | 2/1996 | Cavers ................................. | 330/151 |
| 5,570,063 | 10/1996 | Eisenberg ........................... | 330/149 |
| 5,929,704 | * 7/1999 | Proctor et al. ..................... | 330/149 |
| 5,963,090 | * 10/1999 | Fukuchi ............................. | 330/149 |

FOREIGN PATENT DOCUMENTS

98/12800  3/1998  (WO) .

* cited by examiner

Primary Examiner—Steven J. Mottola
(74) Attorney, Agent, or Firm—Altera Law Group, LLC

(57) ABSTRACT

The invention relates to a linearization method and an amplifier arrangement, in which a signal to be amplified is predistorted by utlilizing digital predistortion information stored in the memory of a predistortion controller. Predistortion means predistort the signal to be amplified in its analogue form, the predistortion is adapted at least to the signal to be amplified, the predistorion information stored in the memory of the controller correspond to the variables of polar coordinates, such as phase and amplitude, and the phase and amplitude of the signal to be amplified are distorted in the predistortion in accordance with the predistortion information located in the memory of the controller.

8 Claims, 2 Drawing Sheets

LINEARIZATION METHOD AND AMPLIFIER ARRANGEMENT

This application is a continuation of PCT/FI98/00832 filed Oct. 26, 1998.

FIELD OF THE INVENTION

The invention relates to a linearization method in which a signal to be amplified is predistorted by utilizing digital predistortion information stored in a memory.

The invention further relates to an amplifier arrangement comprising predistortion means and a memory in which digital predistortion information is stored.

BACKGROUND OF THE INVENTION

The operating range of radio frequency power amplifiers is wider than that of small-signal amplifiers; hence, the power amplifiers are non-linear. For example, a base station in a cellular radio system simultaneously receives and amplifies signals of different frequencies from several terminals. In the prior art solutions, attempts have been made to correct signal distortion caused by power amplifier intermodulation by using feedforwarding or predistortion. In feedforward solutions, two control loops provided with a main amplifier for the actual signal and a distortion amplifier for signal distortion are typically applied. Distortion feedforwarding is here used for correcting the actual signal.

In the prior art solution employing predistortion, an estimate is made of the manner in which an amplifier will distort a signal. The signal to be amplified by means of the estimate is predistorted by a distortion transformation opposite to the amplifier distortion. The amplifier then, while amplifying the signal, simultaneously compensates for the predistortion, yielding an undisturbed, so-called linearized signal.

In the prior art solutions, predistortion is performed either analogically or digitally. It is difficult to detect changes in amplifier distortion in analogue predistortion; hence, digital predistortion is more advantageous. It is possible to correct distortion extremely efficiently by digital predistortion. A typical digital predistortion is performed by using lookup tables, which should, in addition, advantageously be updated in order to achieve adaptability since amplifier distortion is affected by temperature, the age of the amplifier and the changes of the signal fed to the amplifier, for example. U.S. Pat. No. 5,049,832, which is incorporated herein by reference, discloses one such solution. In the solution of the publication, predistortion information is stored in a memory in rectangular coordinate form, which aims to reduce the amount of information to be stored, and hence an attempt is made to quicken the adaptability of the solution in changing circumstances.

Typically, a problem of this kind of totally digital predistortion is slowness, however. The current digital signal processing technique enables the bandwidth to range from a few dozen to a maximum of a few hundred kilohertz when complex amplification predistortion is used. Bandwidth is even narrower when polar predistortion is used on account of numerous transformation computations. Furthermore, another problem of digital predistortion is the estimation of the delay caused by a power amplifier.

BRIEF DESCRIPTION OF THE INVENTION

An object of the invention is thus to provide a method and an arrangement implementing the method so as to solve the above problems. In the invention the slowness of digital predistortion and the poor adaptability to changes of analogue predistortion can be avoided.

This is achieved by a method of the type described in the introduction, which is characterized in that the signal to be amplified is predistorted in its analogue form, the predistortion is adapted to the signal to be amplified, the predistortion information stored in the memory corresponds to the variables of polar coordinates, such as phase and amplitude, and the phase and amplitude of the signal to be amplified are distorted in the predistortion in accordance with the predistortion information.

An amplifier arrangement of the invention, in turn, is characterized in that the predistortion means are arranged to distort a signal to be amplified in its analogue form, a receiver arrangement is arranged to adapt the predistortion to the signal to be amplified, the predistortion information stored in the memory comprises the variables phase and amplitude of polar coordinates, and the predistortion means are arranged to distort the phase and amplitude of the signal in accordance with the predistortion information.

Several advantages can be achieved by the method and arrangement of the invention. The time-consuming computational operations of digital predistortion can be replaced by a table lookup. The invention enables polar presentation to be also employed in broadband applications.

BRIEF DESCRIPTION OF THE DRAWINGS

The invention is now described in closer detail in connection with the preferred embodiments with reference to the accompanying drawings, in which.

DETAILED DESCRIPTION OF THE DRAWINGS

The invention is suited particularly for use in a cellular radio system in a power amplifier of a base station transmitter without being restricted thereto, however.

Figure 1:
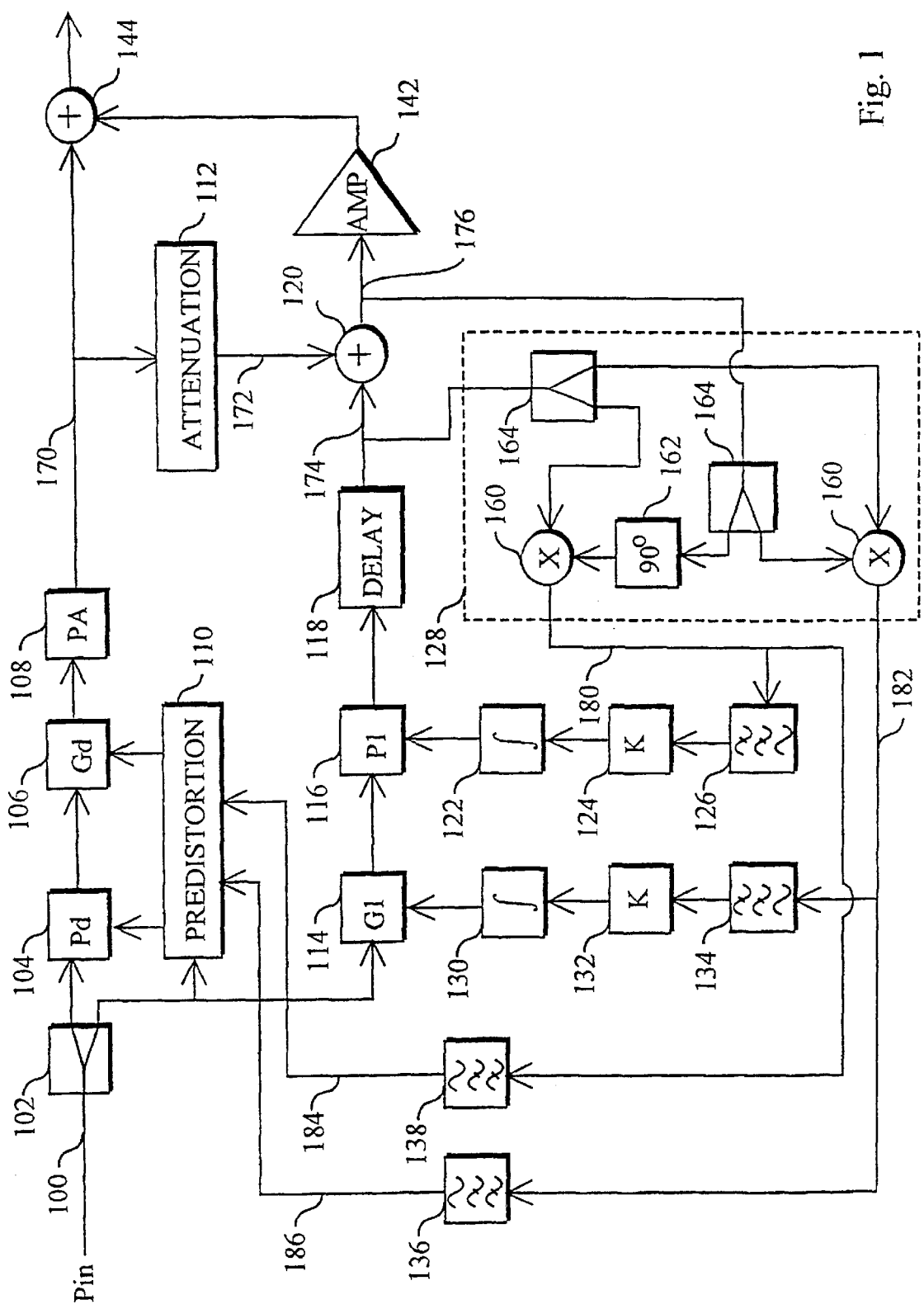
FIG. 1 shows a predistorting amplifier.

FIG. 1 shows a predistorting amplifier arrangement in accordance with the invention. The arrangement comprises a signal splitter 102, a phase predistorter 104, an amplitude predistorter 106, a power amplifier 108, a distortion controller 110, an attenuator 112, an amplitude distorter 114, a phase distorter 116, delay means 118, a summer 120, a first integrator 122, a first amplifier 124, a first low-pass filter 126, a multiplier 128, a second integrator 130, a second amplifier 132, a second low-pass filter 134, a first high-pass filter 136, and a second high-pass filter 138. The multiplier 128, which is a quadrature demodulator, comprises multiplying means 160, a phase shifter (90°) 162 and a signal splitter 164. The arrangement can further comprise a feed-forward amplifier 142 and a summer 144 in which an error signal 176 is subtracted from an outgoing signal 170 to reduce intermodulation distortion. The arrangement operates as described in the following. Let us first examine the non-feedback operation of the amplifier. A signal 100 to be amplified is split in two in the splitter 102. The upper signal propagates further to the predistorting means 104 and 106 in which the phase and amplitude of the signal 100 are changed. The means to change phase and amplitude 104 and 106 distort the phase and amplitude of the signal 100 coming to the amplifier 108 in such a manner that the output of the amplifier 108 is substantially undistorted.

Let us now take a closer look at the generation of the error signal 176. First, a modulation signal $v_m$ 174 is generated in such a manner that the signal 100 to be amplified propagates through the splitter 102 to the distortion means 114 and 116 which generate the expected value of the signal, where-upon the signal is delayed in the delay means 118. Hence, the delay of the signal 174 corresponds to the delay of the signal 100 to be amplified in the distortion means 104 and 106 and the power amplifier 108. The error signal 176 is generated by subtracting in the summer 120 an output signal 172 attenuated to a level corresponding with the error signal 176 in the attenuator 112 from the modulation signal 174.

Let us now examine in closer detail the generation of the expected value of the modulation signal 174. The modulation signal 174 and the error signal 176 are both fed to the quadrature modulator 128 in which a phase control signal 180 and an amplitude control signal 182 are generated by using the quadrature demodulator multipliers 160, the phase shifter 162 and the signal splitters 164 in a known manner. The phase control signal 180 is low-pass filtered in the filter 126, amplified in the amplifier 124 and integrated, in other words effectively averaged, in the integrator 122. The signal 100 to be amplified is distorted in the phase distorting means 116 by a phase control signal 186 processed and effectively averaged in this manner. Similarly, the amplitude control signal 182, which is also low-pass filtered in the filter 134, is amplified in the amplifier 132 and integrated, in other words effectively averaged, in the integrator 130. The signal 100 to be amplified is distorted in the amplitude distorting means 114 by an amplitude control signal 184 processed and effectively averaged in this manner. Such distortion which averages phase and amplitude forms the expected value of the signal 100 to be amplified from the modulation signal 174 in the time slot covered by the integrators 122 and 130. In other words, the error signal 176 indicates only the rapid changes of the signal 100 to be amplified, since the slow changes are summed out.

The solution of the invention changes phase and amplitude distortion quickly by the means 104 and 106 depending on how much the error signal 176 deviates from the modulation signal 174 which corresponds to the expected value, in other words to the average value, of the signal 100 to be amplified. Hence, the inventive solution is adaptive to changes in circumstances. The adaptability is implemented in such a manner that the phase and amplitude control signals 184 and 186 low-pass filtered by the filters 136 and 138 are fed to the distortion controller 110. These signals and the signal to be amplified are used to select the appropriate predistortion information from the table.

Figure 2:
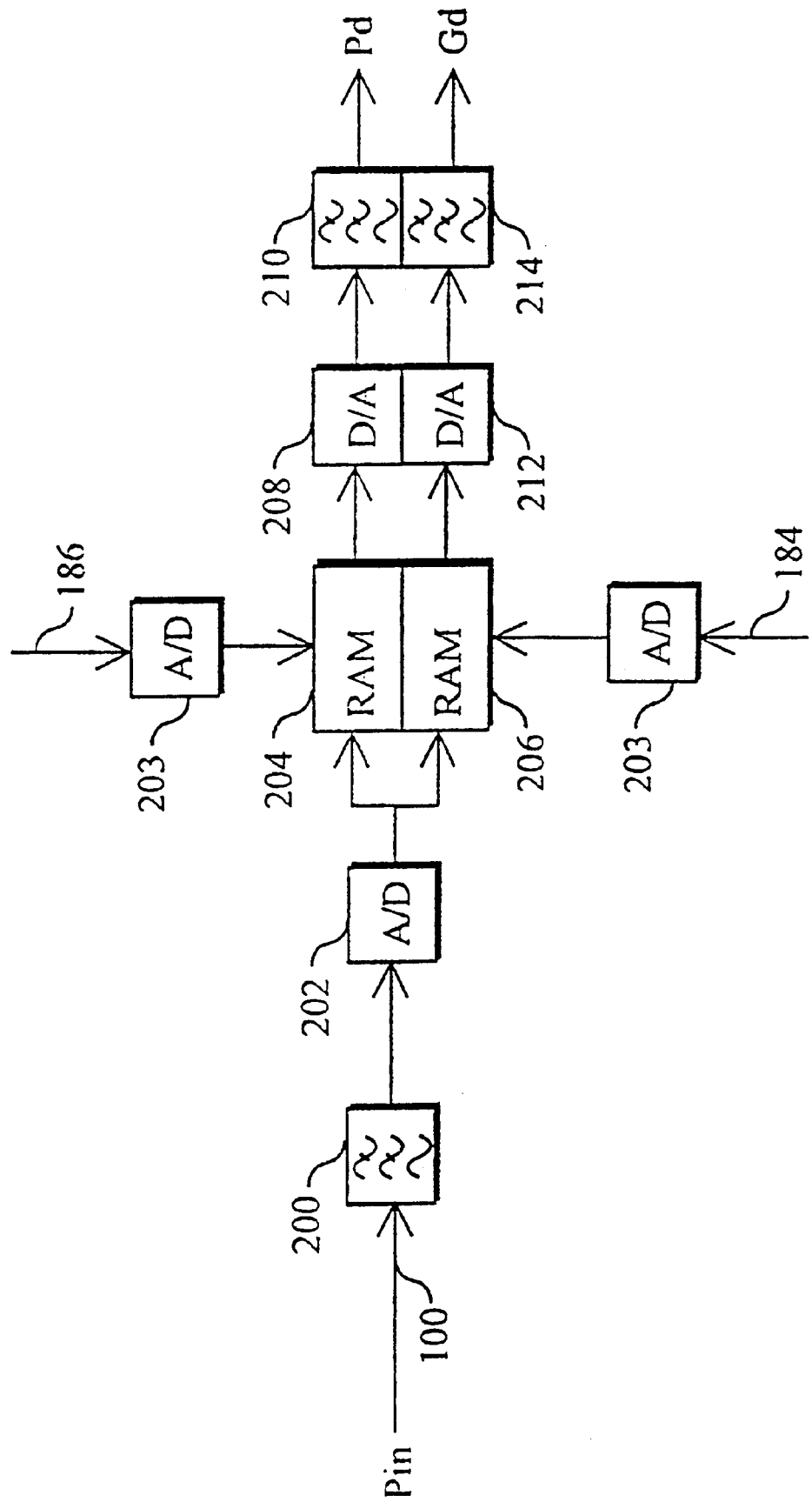
FIG. 2 shows a predistortion controller.

Let us now examine in closer detail a selection of predistortion information in accordance with the invention. FIG. 2 shows a predistortion controller 110 comprising a first low-pass filter 200, an A/D converter 202, a first memory 204, a second memory 206, a D/A converter 208, a second low-pass filter 210, a second D/A converter 212 and a third low-pass filter 214. The controller 110 operates in the following manner. The first low-pass filter 200 removes rapid changes from a signal 100 to be amplified, whereupon the signal is converted into digital form in the converter 202. The digital signal is directly used to control the memories 204 and 206, the memory 204 controlling phase predistortion and the memory 206 controlling amplitude predistortion. The digital information of phase predistortion is converted into analogue information in the first D/A converter 208 and filtered by the second low-pass filter 210. Similarly, the digital information of amplitude predistortion is converted into analogue information in the second D/A converter 212 and filtered by the third low-pass filter 214. These analogue control signals control analogue and usually also radio frequency predistortion means 104 and 106 in a known manner to distort phase and amplitude.

Although the polar variables amplitude and phase have been described as separate variables they can, however, be denoted and processed as one variable by using complex presentation and by processing the variables as vectors. Hence, a variable $\alpha$, $\alpha = g + jp$ can be defined, where j is an imaginary unit and g is amplitude and p is phase. The variable $\alpha$ can also be entered $\alpha = gG + pP$ in accordance with the unit vectors of amplitude G and phase P. The signals 100, 184, 186 applied to the memory 204 and 206 of the distortion controller 110 can be presented in this form, and the two control signals 184 and 186 can thus be replaced by one complex signal which, in turn, can be presented in digital form in a known manner. The memory 204, 206 is preferably a RAM memory comprising several input ports for the signals 100, 184 and 186. The memory 204, 206 is preferably a dual-port RAM memory in which different kind of amplitude and phase predistortion information is stored.

Since the memory 204, 206 is digital, the memory accepts amplitude and phase values formed only at successive points of sampling time. Hence, a new parameter $\alpha_{n+1}$ controlling distortion, which corresponds to the signals 184 and 186 or the signal 100, for example, is generally derived from the preceding parameter $\alpha_n$ by means of the following formula:

$$\alpha_{n+1} = \alpha_n - K\Delta E[v_e^2],$$

where E is the expected value operator, $\alpha_n$ is the current parameter used in processing the signal, K is the amplifier coefficient, $$\nabla = \frac{\partial}{\partial g}G + \frac{\partial}{\partial p}P$$

means the nabla operator by which the vector-form partial derivative of a scalar function with respect to the orthogonal unit vectors G and P is formed. This partial differentiation, also called a gradient, is often replaced by multiplying a modulation signal 174 $v_m$ and an error signal 176 $v_e$ by one another, whereby $\alpha_{n+1} = \alpha_n - KV_mV_e$. This multiplying corresponds to the quadrature demodulation in means 120 and the expected value of the original clause is included in the averaging of the modulation signal 174.

Although the invention has been described above with reference to the example in accordance with the accompanying drawings, it is obvious that the invention is not restricted thereto but it can be modified in many ways within the scope of the inventive idea disclosed in the attached claims.

What is claimed is:

1. A linearization method in which a signal to be amplified is predistorted by utilizing digital predistortion information stored in a memory, comprising:

generating a modulation signal corresponding to an average value of a signal to be amplified, determining a deviation between an error signal and the modulation signal, the modulation signal and the error signal are quadrature-modulated for generating a distortion control signal, predistorting the signal to be amplified in its analogue form, adapting the predistortion to the signal to be amplified, wherein predistortion information stored in memory corresponds to variables of polar coordinates, such as phase and amplitude, the memory being controlled by the signal to be amplified and a digitally converted distortion control signal, and distorting the phase and amplitude of the signal to be amplified are in accordance with the predistortion information.

2. A method as claimed in claim 1, wherein the predistortion is adapted to the signal to be amplified in such a manner that the memory comprising the stored digital predistortion information is controlled by using the signal to be amplified in such a manner that the signal to be amplified is converted into digital form before the control of the memory.

3. A method as claimed in claim 2, wherein the predistortion information is stored in a lookup table memory comprising a multi-input port.

4. A method as claimed in claim 1, wherein predistortion means are analogue, whereby the predistortion information supplied from the memory to control the predistortion means is converted into analogue information.

5. An amplifier arrangement comprising:

a modulation signal corresponding to an average value of a signal to be amplified, an error signal, compared with the modulation signal, for determining a deviation between the error signal and the modulation signal, a quadrature demodulator arranged to demodulate the modulation signal and the error signal for generating a distortion control signal, predistortion circuits and a memory in which digital predistortion information is stored, the predistortion circuits are arranged to distort a signal to be amplified in its analogue form, a receiver arrangement is arranged to adapt the predistortion to the signal to be amplified, the predistortion information stored in the memory comprises phase and amplitude variables of polar coordinates, wherein an analogue/digital converter is arranged to convert the distortion control signal into digital form, a resulting digitally converted distortion control signal is arranged to control the memory comprising the stored digital predistortion information, and the predistortion circuits are arranged to distort the phase and amplitude of the signal in accordance with the predistortion information.

6. An amplifier arrangement as claimed in claim 5, wherein the predistortion means are arranged to adapt the predistortion to the signal to be amplified in such a manner that an analogue/digital converter converts the signal to be amplified into digital form, and after the conversion the digital signal is arranged to control the memory comprising the stored digital predistortion information.

7. An amplifier arrangement as claimed in claim 5, wherein the predistortion information is stored in a lookup table memory comprising a multi-input port.

8. An amplifier arrangement as claimed in claim 5, wherein the predistortion means are analogue, and digital/analogue converters are arranged to convert the predistortion information supplied from the memory and intended to control the predistortion means into analogue information.

* * * * *